United States Patent
Schindler et al.

[11] Patent Number: 5,962,069
[45] Date of Patent: Oct. 5, 1999

[54] PROCESS FOR FABRICATING LAYERED SUPERLATTICE MATERIALS AND $AB0_3$ TYPE METAL OXIDES WITHOUT EXPOSURE TO OXYGEN AT HIGH TEMPERATURES

[75] Inventors: Gunther Schindler; Walter Hartner, both of Munich; Carlos Mazuré, Zorneding, all of Germany; Narayan Solayappan, Colorado Springs, Colo.; Vikram Joshi, Colorado Springs, Colo.; Gary F. Derbenwick, Colorado Springs, Colo.

[73] Assignees: Symetrix Corporation, Colorado Springs, Colo.; Siemens Aktiengesellschaft, Munich, Germany

[21] Appl. No.: 08/900,270

[22] Filed: Jul. 25, 1997

[51] Int. Cl.$^6$ .......................... B05D 3/02; H01L 21/3205
[52] U.S. Cl. .................. 427/226; 427/126.3; 427/372.2; 427/79; 427/96; 438/3
[58] Field of Search .......................... 427/226, 96, 126.3, 427/79, 372.2; 438/3

[56] References Cited

U.S. PATENT DOCUMENTS 5,468,684  11/1995  Yoshimori et al. ...................... 437/228
5,508,226   4/1996  Ito et al. ................................. 437/130

FOREIGN PATENT DOCUMENTS 0 489 519 A2  6/1992  European Pat. Off. ...... H01L 21/314
09-312381    12/1997  Japan ........................... H01L 27/108
WO 96/29727   9/1996  WIPO ........................ H01L 21/3205

OTHER PUBLICATIONS

Y. Shi, E. Sanchez–Carambot, L.J. Martinez–Miranda, and J.J. Santiago–Aviles; "Growth of $BaTiO_3$ Thin Films By Metallo–Organic Deposition and Rapid Thermal Annealing Under Controlled Atmosphere"; 1990 IEEE 7th International Symposium On Applications Of Ferroelectrics, Urbana–Champaign, Illinois, USA, Jun. 6–8, 1990; pp. 720–721.
Azar Nazeri; "Crystallization of sol–gel deposited potassium–tantalate–niobate thin films on platinum"; Applied Physics Letters, vol. 65, No. 3, Jul. 18, 1994; pp. 295–297.
Aslam et al, Appl. Phys. lett. 53(2) Jul. 1988, p. 153–156.

Primary Examiner—Roy V. King
Attorney, Agent, or Firm—Duft, Graziano & Forest, P.C.

[57] ABSTRACT

A liquid precursor containing a metal is applied to a first electrode, dried in air at a first temperature of 160° C. and then a second temperature of 260° C., RTP baked at a temperature of 300° C. in oxygen, RTP baked at a temperature of 650° C. in nitrogen, and annealed at a temperature of 800° C. in nitrogen to form a strontium bismuth tantalate layered superlattice material. A second electrode is deposited and then the device is patterned to form a capacitor, and a second anneal is performed at a temperature of 800° C. in nitrogen. Alternatively, the second anneal may be performed in oxygen at a temperature of 600° C. or less. In this manner, a high electronic quality thin film of a layered superlattice material is fabricated without a high-temperature oxygen anneal.

26 Claims, 6 Drawing Sheets

PROCESS FOR FABRICATING LAYERED SUPERLATTICE MATERIALS AND AB0₃ TYPE METAL OXIDES WITHOUT EXPOSURE TO OXYGEN AT HIGH TEMPERATURES

BACKGROUND OF THE INVENTION

1. Field of the Invention

The invention in general relates to the fabrication of layered superlattice materials and $ABO_3$ type metal oxides, and more particularly to fabrication processes that provide high-polarizability and low fatigue ferroelectric integrated circuit devices and low-leakage current high dielectric constant integrated circuit devices without exposure to oxygen at high temperatures.

2. Statement of the Problem

It has been known for more than 30 years that if a memory utilizing the polarizability property of ferroelectric materials could be made, such a memory would be non-volatile, of high density, and have many other advantages. See, for example, U.S. Pat. No. 5,046,043 issued to William D. Miller et al. It is also known that the substitution of high dielectric constant materials for the silicon dioxide of conventional memories such as DRAM's could result in memories that were much more dense. See, for example, European Patent Application Serial No. 0 415 751 A1 of NEC Corporation. Thus, a large amount of research has been performed for many years to obtain materials with suitable ferroelectric properties and suitable high dielectric constant properties. However, until recently, no one had been able to find a material that had ferroelectric properties or high dielectric properties that made it suitable for fabricating a practical ferroelectric memory or dielectric memory with a suitably high dielectric constant. All ferroelectric materials with suitably high polarizabilities fatigued, and most dielectric materials with suitably high dielectric constant had excessive leakage currents.

U.S. Pat. No. 5,519,234 issued May 21, 1996 discloses that layered superlattice materials, such as strontium bismuth tantalate, have excellent properties in ferroelectric applications as compared to the best prior materials and have high dielectric constants and low leakage currents. U.S. Pat. Nos. 5,434,102 issued Jul. 18, 1995 and 5,468,684 issued Nov. 21, 1995 describe processes for integrating these materials into practical integrated circuits. U.S. Pat. No. 5,508,226 issued Apr. 16, 1996 discloses a process for making layered superlattice materials in which a lower temperature anneal of about 700° C. is used.

The processes for fabricating layered superlattice materials described in the above patents and all other prior art all include high temperature oxygen anneals, i.e. anneals in oxygen at temperatures higher than 600° C. According to all the prior art relating to the fabrication of layered superlattice materials, high temperature anneals in oxygen are required to produce a high polarizability and other electronic properties which are necessary for use of these materials in integrated circuits. See, for example, U.S. Pat. No. 5,508, 226. According to the prior art, this is because the layered superlattice materials utilized in these patents are all complex oxides and the oxygen is required to assure that oxygen vacancy defects are not created in the fabrication process.

While fabricating processes using high temperature anneals in oxygen do produce layered superlattice materials with excellent electrical properties for use in integrated circuits, they also have significant deleterious effects on many conventional integrated circuit materials. For example, materials such as polysilicon and titanium that are commonly used as conductors in integrated circuits oxidize in such anneals and become insulators. This creates thin capacitors in areas where they are not desirable. Exposure to oxygen at high temperatures can also lead to defects in many materials used in integrated circuits, such as semiconducting silicon.

The prior art has attempted to avoid these destructive effects of high temperature oxygen anneals by device designs which isolate the layered superlattice materials from the transistors and other sensitive conventional integrated circuit components. For example, U.S. Pat. No. 5,468,684 issued Nov. 21, 1995 locates the layered superlattice material capacitors on a thick protective coating well above and away from the transistor. This however, results in an integrated circuit that is less dense than it would otherwise be. Other prior art has used barrier layers to attempt to avoid damaging the sensitive integrated circuit components, but the barrier layers are also susceptible to damage by the high temperature oxygen anneals. Thus, it would be highly desirable to have a layered superlattice material fabrication process that produces high quality electronic devices without using a high temperature oxygen anneal.

SUMMARY OF THE INVENTION

The present invention provides a process for fabricating thin films of layered superlattice materials and $ABO_3$ type metal oxides for use in integrated circuits, which process exposes the integrated circuit to oxygen only at temperatures of 600° C. or less, and preferably of 500° C. or less, and at the same time provides high quality integrated circuit devices utilizing these materials.

The invention provides a method of fabricating a material selected from the group consisting of layered superlattice compounds and $ABO_3$ type metal oxide compounds, the method comprising: providing a substrate, and a precursor containing metal moieties in effective amounts for spontaneously forming one of the materials upon heating the precursor; applying the precursor to the substrate to form a precursor film; and heating the precursor film in an oxygen-free atmosphere at a temperature of between 600° C. and 900° C. to form a solid thin film of the metal oxide on the substrate. Preferably, the step of heating comprises rapid thermal processing the precursor at a temperature of between 500° C. and 850° C. Preferably, the atmosphere comprises nitrogen, the rapid thermal processing temperature is about 650° C., and the rapid thermal processing is done for about 30 seconds. Preferably, the step of heating comprises annealing in an inert atmosphere at between about 700° C. and 900° C. Preferably, the step of annealing comprises annealing at a temperature of about 800° C. in a nitrogen atmosphere for about thirty minutes. Preferably, the substrate comprises a first electrode, and the method further comprises the steps of forming a second electrode on the metal oxide, after the step of annealing, to form a capacitor, and subsequently performing a second anneal in an oxygen-free atmosphere at a temperature of between 300° C. and 900° C. Preferably, the second anneal temperature is about 800° C. and is in a nitrogen atmosphere. Alternatively, the second anneal is in oxygen at 600° C. Preferably, the metal oxide comprises a layered superlattice material, and most preferably, strontium bismuth tantalate. Preferably, the method further includes the step of rapid thermal processing the precursor film in an atmosphere including oxygen at a temperature of from 200° C. up to 500° C. Preferably, the method also includes the step of drying the precursor film in air at a temperature of between 140° C. and 320° C.

Preferably, the material forms a portion of an integrated circuit memory. Preferably the memory is a memory selected from the group consisting of DRAMs and ferroelectric FETs.

In another aspect the invention provides a method of fabricating a metal oxide selected from the group comprising layered superlattice compounds and $ABO_3$ type compounds: providing a substrate, and a precursor containing metal moieties in effective amounts for spontaneously forming one of the metal oxides upon heating the precursor; applying the precursor to the substrate; drying the precursor to form a solid thin film; and heating the solid thin film on the substrate without exposing it to oxygen while at a temperature of 600° C. or higher to form the material on the substrate. Preferably, the step of heating comprises rapid thermal processing the solid thin film at a temperature of between 500° C. and 850° C. Preferably, the step of heating also comprises annealing the solid thin film at a temperature of from 700° C. to 900° C. Preferably, the substrate comprises a first electrode, and the method further comprises the steps of forming a second electrode on the material after the step of annealing, to form a capacitor, and subsequently performing a second anneal in an oxygen-free atmosphere at a temperature of between 300° C. and 900° C. Preferably, the material forms a portion of an integrated circuit memory. Preferably the memory is a memory selected from the group consisting of DRAMs and ferroelectric FETs.

The preferred method described above exposes the integrated circuit including the material to oxygen only at temperatures of 600° C. or lower, yet result in layered superlattice materials with excellent electronic properties. For example, ferroelectric layered superlattice materials with polarizabilities, 2Pr, higher than 20 microcoulombs per square centimeter and leakage currents of less than $10^{-8}$ amps per centimeter squared over the 1 volt to 5 volt range of operation of conventional DRAM memories have been fabricated. Significantly, $SrBi_2Ta_2O_9$ capacitors with higher polarizabilities than any prior art $SrBi_2Ta_2O_9$ capacitors have been made using this oxygen-free, high-temperature anneal process. Numerous other features, objects and advantages of the invention will become apparent from the following description when read in conjunction with the accompanying drawings.

DESCRIPTION OF THE PREFERRED EMBODIMENT

1. Overview

Figures 2, 3:
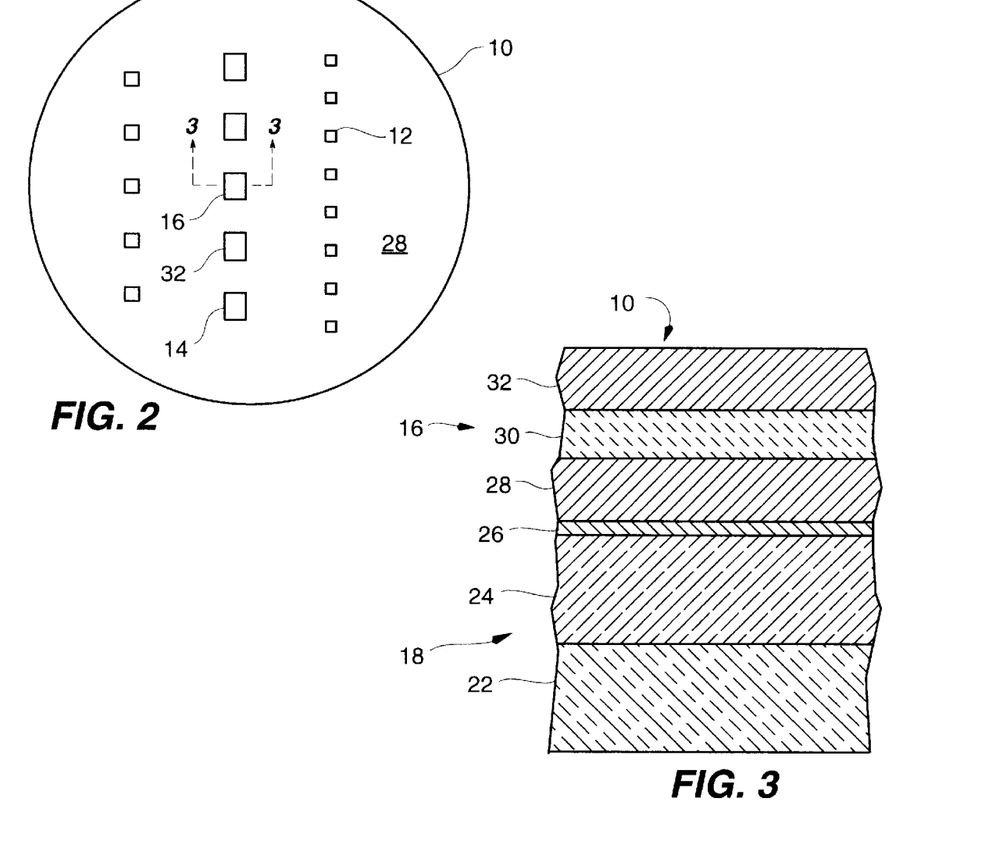
FIG. 2 is a top view of a wafer on which thin film capacitors fabricated by the process according to the invention are shown greatly enlarged.
FIG. 3 is a portion of a cross-section of FIG. 2 taken through the lines 3—3, illustrating a thin film capacitor device fabricated by the process of FIG. 1.

Directing attention to FIGS. 2 and 3, a wafer 10 containing numerous capacitors 12, 14, 16, etc. is shown. FIG. 2 is a top view of the wafer 10 on which the thin film capacitors 12, 14, 16 etc. fabricated by the process according to the invention are shown greatly enlarged. FIG. 3 is a portion of a cross-section of FIG. 2 taken through the lines 3—3 bisecting capacitor 16. Referring to FIG. 3, the wafer 10 includes a substrate 22, an insulating layer 24, a thin adhesion layer 26 which assists the next layer, electrode 28, in adhering to the silicon dioxide 24, a layer of a ferroelectric/high dielectric constant material 30, and another electrode 32. After the layers 24, 26, 28, 30, and 32, are deposited, the wafer is etched down to layer 28 to form the individual capacitors 12, 14, 16, etc. which are interconnected by the bottom electrode 28. The invention primarily involves the method of creating the layer 30 of a ferroelectric or high dielectric constant material, preferably a layered superlattice material, but which also be a ferroelectric and/or a dielectric $ABO_3$ type metal oxide, such as lead zirconium titanate (PZT) or barium strontium titanate (BST). Layered superlattice materials, which may alternatively be referred to as layered superlattice compounds, comprise complex oxides of metals, such as strontium, calcium, barium, bismuth, cadmium, lead, titanium, tantalum, hafnium, tungsten, niobium zirconium, bismuth, scandium, yttrium, lanthanum, antimony, chromium, and thallium that spontaneously form layered superlattices, i.e. crystalline lattices that include alternating layers of distinctly different sublattices. The word "material" or "compound" is specifically used in combination with the term "layered superlattice" to indicate that the layered superlattice materials are a single material or a single chemical compound, thereby distinguishing these materials from compositional superlattices, which are heterostructures made of alternating layers of several different materials. Generally each layered superlattice material will include two or more of the above metals; for example, barium, bismuth and niobium form the layered superlattice material barium bismuth niobate, $BaBi_2Nb_2O_9$. The material 30 may be a dielectric, a ferroelectric, or both. If it is a dielectric, the capacitor 16 is a dielectric capacitor, and if the material 30 is a ferroelectric, then capacitor 16 is a ferroelectric capacitor. The layered superlattice materials may be summarized more generally under the formula:

$$A1_{w1}^{+a1} A2_{w2}^{+a2} \ldots Aj_{wj}^{+aj} S1_{x1}^{+s1} S2_{x2}^{+s2} \ldots Sk_{xk}^{+sk} B1_{y1}^{+b1} B2_{y2}^{+b2} \ldots Bl_{yl}^{+bl} Q_z^{-2}, \quad (1)$$

where A1, A2 . . . Aj represent A-site elements in the perovskite-like structure, which may be elements such as strontium, calcium, barium, bismuth, lead, and others S1, S2 . . . Sk represent superlattice generator elements, which usually is bismuth, but can also be materials such as yttrium, scandium, lanthanum, antimony, chromium, thallium, and other elements with a valence of +3, B1, B2 . . . Bl represent B-site elements in the perovskite-like structure, which may be elements such as titanium, tantalum, hafnium, tungsten, niobium, zirconium, and other elements, and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{.75}Ba_{.25}Bi_2Ta_2O_9$, on the average, 75% of the time Sr is the A-site atom and 25% of the time Ba is the A-site atom. If there is only one A-site element in the compound then it is represented by the "A1" element and $w2 \ldots wj$ all equal zero. If there is only one B-site element in the compound, then it is represented by the "B1" element, and $y2 \ldots yl$ all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$$(a1w1+a2w2 \ldots +ajwj)+(s1 \times 1+s2 \times 2 \ldots +skxk)+(b1y1+b2y2 \ldots +bjyj)=2z \qquad (2)$$

Formula (1) includes all three of the Smolenskii type compounds discussed in U.S. Pat. No. 5,519,234 issued May 21, 1996, which is hereby incorporated by reference as though fully incorporated herein. The layered superlattice materials do not include every material that can be fit into the formula (1), but only those which spontaneously form themselves into crystalline structures with distinct alternating layers.

It should also be understood that the term layered superlattice material herein also includes doped layered superlattice materials. That is, any of the material included in formula (1) may be doped with a variety of materials, such as silicon, germanium, uranium, zirconium, tin or hafnium. For example, strontium bismuth tantalate may be doped with a variety of elements as given by the formula:

$$(Sr_{1-x}M1_x)Bi_2(Nb_{1-y}M2_y)O_9+\alpha M3O \qquad (2)$$

where M1 may be Ca, Ba, Mg, or Pb, M2 may be Ta, Bi, or Sb, with x and y being a number between 0 and 1 and preferably $0 \leq x \leq 0.2$, $0 \leq y \leq 0.2$, M3 may be Si, Ge, U, Zr, Sn, or Hf, and preferably $0 \leq \alpha \leq 0.05$. Materials included in this formula are also included in the term layered superlattice materials used herein.

Similarly, a relatively minor second component may be added to a layered superlattice material and the resulting material will still be within the invention. For example, a small amount of an oxygen octahedral material of the formula $ABO_3$ may be added to strontium bismuth tantalate as indicated by the formula:

$$(1-x)SrBi_2Ta_2O_9+xABO_3 \qquad (3)$$

where A may be Bi, Sr, Ca, Mg, Pb, Y, Ba, Sn, and Ln; B may be Ti, Zr, Hf, Mn, Ni, Fe, and Co; and x is a number between 0 and 1, preferably, $0 \leq x \leq 0.2$.

Likewise the layered superlattice material may be modified by both a minor $ABO_3$ component and a dopant. For example, a material according to the formula:

$$(1-x)SrBi_2Ta_2O_9+xABO_3+\alpha MeO, \qquad (4)$$

where A may be Bi, Sb, Y and Ln; B may be Nb, Ta, and Bi; Me may be Si, Ge, U, Ti, Sn, and Zr; and x is a number between 0 and 1, preferably, $0 \leq x \leq 0.2$, is contemplated by the invention.

$ABO_3$ type metal oxides are a well-known group of ferroelectric and high dielectric constant materials. See, for example, Franco Jona and G. Shirane, *Ferroelectric Crystals*, Dover Publications, N.Y., p. 108.

Figure 4:
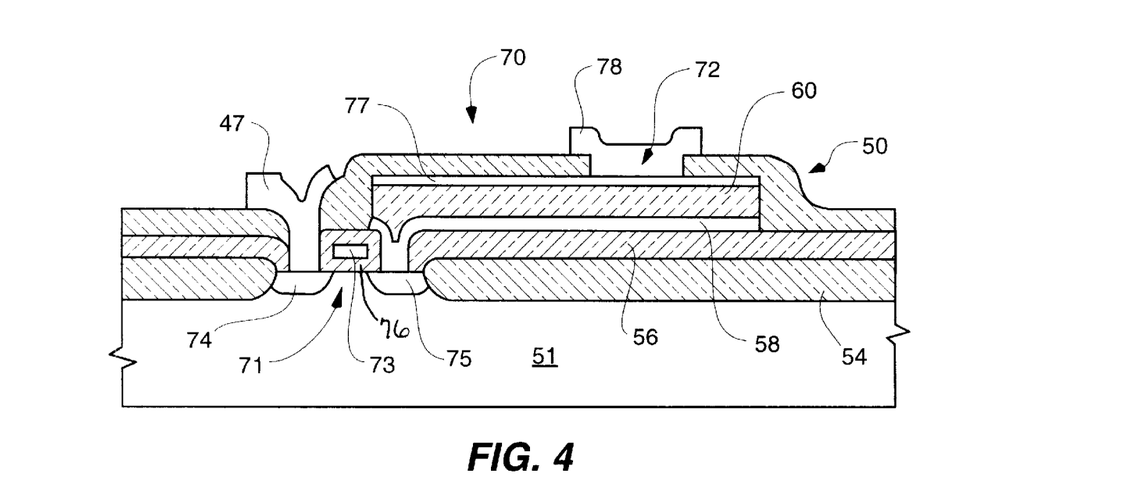
FIG. 4 is a cross-sectional illustration of a portion of an integrated circuit fabricated utilizing the process of the invention.

FIG. 4 shows an example of the integration of a ferroelectric/high dielectric constant capacitor 72 into a DRAM memory cell 50 to form an integrated circuit 70 such as may be fabricated using the invention. The memory cell 50 includes a silicon substrate 51, field oxide areas 54, and two electrically interconnected electrical devices, a transistor 71 and a ferroelectric switching capacitor 72. Transistor 71 includes a gate 73, a source 74, a drain 75, and a gate insulating layer 76. Capacitor 72 includes first electrode 58, ferroelectric/high dielectric constant material 60, and second electrode 77. Insulators, such as 56, separate the devices 71, 72, except where drain 75 of transistor 71 is connected to first electrode 58 of capacitor 72. Electrical contacts, such as 47 and 78 make electrical connection to the devices 71, 72 to other parts of the integrated circuit 70. A detailed example of the complete fabrication process for an integrated circuit memory cell as shown in FIG. 4 is given in U.S. Pat. No. 5,466,629 issued Nov. 14, 1995, which is incorporated herein by reference. It should be understood that FIGS. 2, 3, 4 depicting the capacitors 12, 14, 16 etc. and integrated circuit 70 are not meant to be actual cross-sectional views of any particular portion of an actual electronic device, but are merely idealized representations which are employed to more clearly and fully depict the structure and process of the invention than would otherwise be possible.

This disclosure describes the fabrication and testing of capacitors 12, 14, 16 having layers 30 made of strontium bismuth tantalate. It should be understood, however, that the specific processes and electronic devices described are exemplary; that is the invention contemplates that the layers 30, 60 in FIGS. 3 and 4 may be made of any layered superlattice material or $ABO_3$ type metal oxide. There are also many other variations of the process of the invention than can be included in a document such as this, and the method and materials may be used in many other electronic devices other than the capacitors, such as 12, 14, 16, etc. and the integrated circuit 70 as describe above. For example, the process of the invention can be used in the manufacture of a ferroelectric field effect transistor (FET), such as transistor 71 in FIG. 4. In this embodiment the material 76 is ferroelectric and the memory cell 50 does not include a capacitor 72. That is, as known in the art, the active element that alters its state to store information is the ferroelectric FET 71. It should also be noted that the word "substrate" is used in both a specific and a general sense in this disclosure. In the specific sense it refers to the specific slayer 22, conventionally called a substrate, on which the exemplary electronic devices described are fabricated. In a general sense, it refers to any material, object, or layer on which another layer or layers are formed. In this sense, for example, the layers 22, 24, 26, and 28 comprise a substrate 18 for the layer 30 of layered superlattice material.

A term that is used frequently in this disclosure is "stoichiometry" or "stoichiometric". As used herein, the term stoichiometric generally expresses a relationship between the precursor solution and the final layered superlattice film 30. A "stoichiometric precursor" is one in which the relative proportions of the various metals in the precursor is the same as the proportion in a homogeneous specimen of the intended final layered superlattice thin film 30. This proportion is the one specified by the formula for the final thin film 30.

2. Detailed Description of the Fabrication Process

Figure 1:
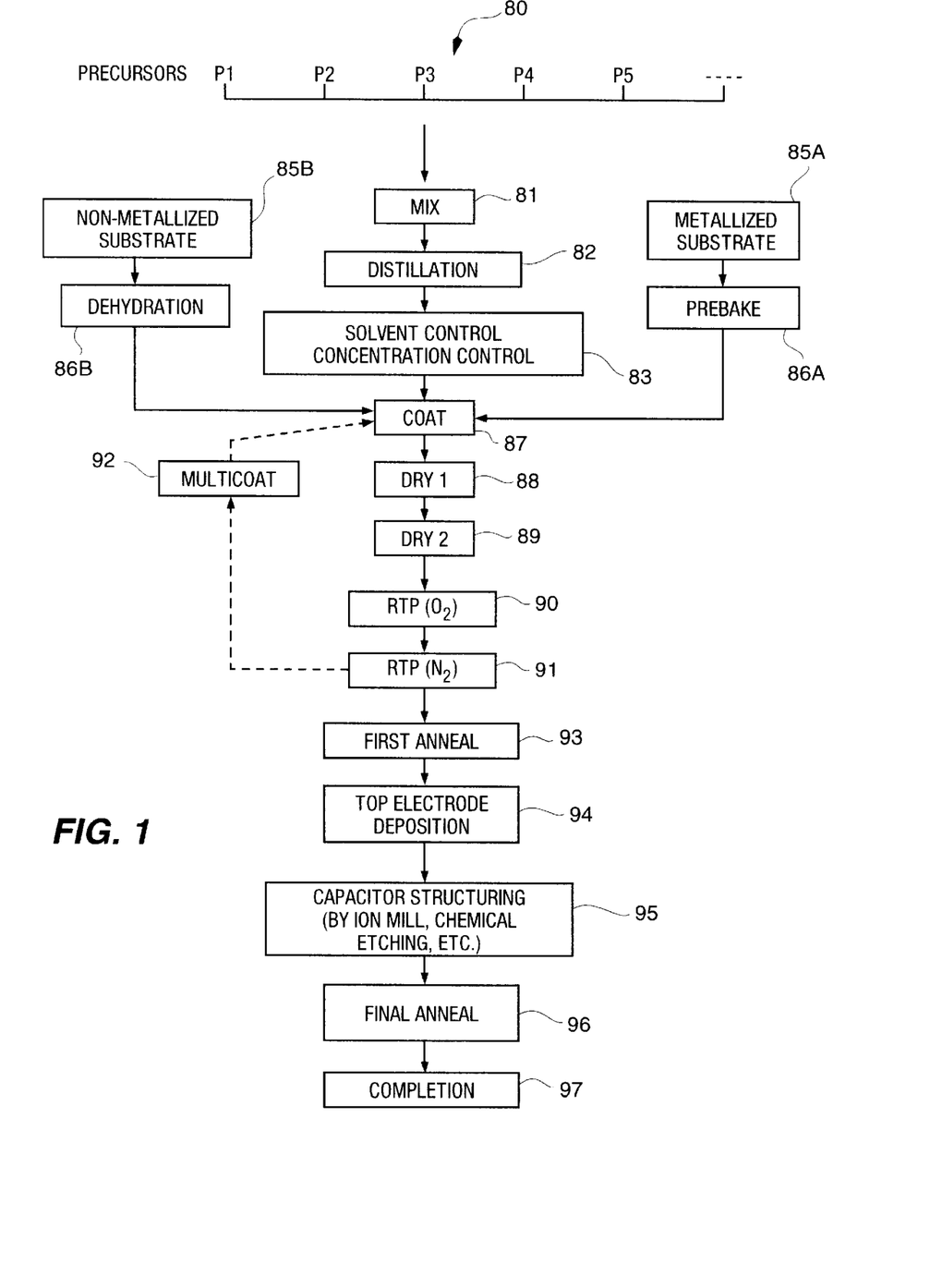
FIG. 1 is a flow chart showing the preferred embodiment of a process for preparing a thin film of a material according to the invention.

Turning now to a more detailed description of the invention, a flow chart of the preferred embodiment of a process according to the invention for preparing a thin film of a layered superlattice material or ABO$_3$ type metal oxide, such as 30 and 60, and a device, such as 10 and 70 incorporating the material 30 and 60, is shown in FIG. 1. We shall first review each step of the preferred process and then provide examples of the process. The first step 80 of the process is the preparation of the precursor or precursors, P1, P2, P3, etc. In the preferred embodiment the precursors are liquids in which a compound or compounds of the metals to comprise the metal oxide 30 are dissolved. The precursors are then mixed in step 81, and the mixed precursors are distilled in step 82. Then follows a solvent control and/or concentration control step 83. Generally this step is taken over two stages which may be separated considerably in time. In the first stage the mixed precursor is dissolved in a suitable solvent and concentrated so as to provide a long shelve life. Just before use, the solvent and concentration may be adjusted to optimize the electronic device that results from the process. The final precursor contains metal moieties in effective amounts for spontaneously forming the desired layered superlattice material or ABO$_3$ type metal oxide upon drying and annealing the precursor.

In parallel with the solvent and concentration control step 83, the substrate 18 is prepared. If the substrate is a metallized substrate, such as the substrate 18, then the substrate is provided in step 85A by forming the layers 22, 24, 26, and 28 and is then prebaked in step 86A. If the substrate is a non-metallized substrate, such as a silicon or gallium arsenide single crystal, the substrate is provided in step 85B and dehydrated in step 86B. In step 87 the substrate is coated with the precursor. In the examples discussed below, the coating was done by a spin-on process, though a process such as a misted deposition process as described in U.S. Pat. No. 5,456,945 issued Oct. 10, 1995, which is hereby incorporated by reference, or dipping or other suitable coating process may be used. The coated substrate is then dried in steps 88 and 89, and then baked in an RTP (rapid thermal processor) unit in steps 90 and 91. If the desired thickness of the layer 30 is not obtained, then the series of coat, dry, and RTP bake steps 87, 88, 89, 90 and 91 are repeated as many times as required to build up the desired thickness, as indicated at 92. The wafer 10 is then annealed in step 93, the top or second electrode 32 is deposited in step 94 by sputtering or other suitable process. The capacitor 16 is then structured by ion milling, chemical etching, or other suitable process in step 95. Then follows, in step 96, a second or final anneal step. This completes the process if a capacitor device as in FIG. 2 is the desired end result, however in the case of an integrated circuit as in FIG. 4, there follows completion steps 97 such as contact metalization, capping, etc. As will be discussed further below, not all of the steps outlined above are necessary for every device: some steps are optional and others are used only for certain layered superlattice materials. It is a feature of the invention that the heating steps after deposition of the metal oxide 30, 60, i.e. the dry steps 88 and 89, the RTA bake steps 90 and 91, the first anneal step 93, and the final anneal step 96, all involve either temperatures of about 600° C. or less, and preferably of 400° C. and lower in an oxygen atmosphere, or the heating is done in a oxygen-free atmosphere, preferably nitrogen, at a temperature of greater than 600° C. The use of a process that is oxygen-free at temperatures of 600° C. and higher for making a layered superlattice compound is also a feature of the invention.

The preferred precursors solutions and their preparation in step 80 are discussed in detail in U.S. Pat. No. 5,423,285 issued Jun. 13, 1995, which is hereby incorporated by reference. Precursors for certain layered superlattice materials, such as strontium bismuth tantalate, are now commercially available from Kojundo Chemical Laboratory Co. Ltd., No. 1-28 5 Chome, Chiyoda, Sakado-shi, Saitama Pref. Japan. Generally a metal or a metal compound is reacted with a carboxylic acid, such as 2-ethylhexanoic acid, to produce a metal hexanoate, which is dissolved in a suitable solvent or solvents, such as xylenes. Other metal-organic acid esters in addition to the 2-ethylhexanotates that may for suitable precursors when compounded with a metal are the acetates and acetylacetonates. For some metals, such as titanium, the precursor metal compound may comprise a metal alkoxide, such as titanium 2-methoxyethoxide. Other alkoxides that may be compounded with a metal and used as precursor compounds include the methoxides, ethoxides, n-propoxide, iso-propoxides, n-butoxides, iso-butoxides, tert-butoxides, 2-methoxyethoxides, and 2-ethoexyethoxides. The precursor metal compound is preferably dissolved in a solvent having a boiling point greater than the boiling point of water, i.e. 100° C. This, in combination with the heating steps in making the precursor, which preferably are performed at temperatures of 115° C. and higher, results in a precursor that is essentially anhydrous. A xylenes solvent works for most metals. For highly electropositive elements, the solvent preferably includes 2-methoxyethanol or n-butyl acetate. Some solvents that may be used, together with their boiling points, include: alcohols, such as 1-butanol (117° C.), 1-pentanol (117° C.), 2-pentanol (119° C.), 1-hexanol (157° C.), 2-hexanol (136° C.), 3-hexanol (135° C.), 2-ethyl-1-butanol (146° C.), 2-methoxyethanol (124° C.), 2-ethoxyethanol (135° C.), and 2-methyl-1-pentanol (148° C.); ketones, such as 2-hexanone (methyl butyl ketone) (127° C.), 4-methyl-2-pentanone (methyl isobutyl ketone) (118° C.), 3-heptanone (butyl ethyl ketone) (123° C.), and cyclohexanone (156° C.); esters, such as butyl acetate (127° C.), 2-methoxyethl acetate (145° C.), and 2-ethoxyethyl acetate (156° C.); ethers, such as 2-methoxyethyl ether (162° C.) and 2-ethoxyethyl ether (190° C.); and aromatic hydrocarbons, such as xylenes (138° C.–143° C.), toluene (111° C.) and ethylbenzene (136° C.).

The precursors of the individual metals may be made separately and then mixed, but generally they are all made together in the same container and mixed as they are made. After mixing, the precursor solution may be distilled to remove water and other undesirable impurities and by-products of the preparation process, although if the precursors and solvents are available in pure enough states, the distillation step 81 may be skipped. The solvent type and concentration may then be adjusted in step 83 either to prepare it for coating, if the coating is to be done immediately, or to provide a precursor with a long shelf life. If the solvent control steps are such as to prepare a solution with a long shelf life, then just before coating, another adjustment will usually be done to optimize the thin film. Some adjustments to produce a long shelf life and to produce high quality films are discussed in detail in U.S. Pat. No. 5,423,285. These may include a solvent exchange step and or the addition of a co-solvent to provide a solvent that produces a better quality film than the solvent in which the precursor was stored.

In steps 85A and 86A, or steps 85B and 86B, a substrate is provided and prepared for coating. Almost any substrate that will support a thin film and is compatible with the materials and processes described herein may be used. Some of these substrates include oxidized or non-oxidized silicon or gallium arsenide semiconducting wafers, with or without integrated circuits and/or metallized layers added, plates of silicon or glass, and other electronic device chips. For the exemplary devices of this disclosure, the substrates were metallized substrates 18 as shown in FIG. 3, including a silicon wafer 22, a layer of silicon dioxide 24 about 5000 Å thick, an adhesion layer 26, preferably titanium or titanium dioxide of from 200 to 500 Å thick, and a platinum electrode 29 about 2000 Å thick. The fabrication of the substrate 18 is described in detail in U.S. Pat. No. 5,423,285 referred to above, and will not be repeated herein. While platinum a platinum electrode 28 with a titanium adhesion layer 26, platinum with a titanium oxide ($TiO_2$) adhesion layer, or platinum alone, are the metallizations used in the examples discussed, numerous other conductors may be used such as ruthenium, $LSCO_x$ (lanthanum strontium cobalt oxide), platinum with an adhesion layer of tantalum, tungsten, molybdenum, chromium, nickel or alloys of these metals, and titanium nitride. Sputtering or vacuum deposition are the preferred deposition processes, though other metallization processes may be used. Heating of the substrates during the metallization deposition is effective to increase adhesion. It has been found that prebaking of the metallized substrate is usually necessary to optimize the electronic properties of the thin film 30. The prebaking step 86A comprises baking in an oxygen atmosphere, preferably at a concentration of between 20% and 100%, and at a temperature of between 500° C. and 1000° C., and preferably 650° C., prior to the coating step 87. Preferably the wafer 10 is baked in a diffusion furnace. The substrate prebake step 86A removes water and organic impurities from the substrate surface. More importantly, the prebaking decreases the internal stress of the metal layer 28 through the annealing effect of the prebaking and the partial oxidation and interdiffusion of the adhesion layer 26 metal. All this increases the adhesion between the substrate 18 and the layered superlattice film 30 and minimizes peeling. Further, if the adhesion layer 26 is a transition metal, the partial oxidation stabilizes the metal chemically. Therefore the number of mobile atoms penetrating into the layered superlattice layer 30 through the platinum layer 28 is drastically decreased, and the layered superlattice layer 30 crystallizes smoothly without defects due to the diffused ions. If the substrate is not metallized, then the silicon or other wafer is dehydrated at a lower temperature.

The precursor mixing, distillation, solvent control, and concentration control steps 81, 82, and 83 have been discussed separately and linearly for clarity. However, these steps can be combined and/or ordered differently depending on the particular liquids used, whether one intends to store the precursor or use it immediately, etc. For example, distillation is usually part of solvent concentration control, as well as being useful for removing unwanted by-products, and thus both functions are often done together. As another example, mixing and solvent control often share the same physical operation, such as adding particular reactants and solvents to the precursor solution in a predetermined order. As a third example, any of these steps of mixing, distilling, and solvent and concentration control may be repeated several times during the total process of preparing a precursor.

The mixed, distilled, and adjusted precursor solution is then coated on the substrate 18. Preferably the coating is done by a spin-on process. The preferred precursor solution concentration is 0.01 to 0.50 M (moles/liter), and the preferred spin speed is between 500 rpm and 5000 rpm.

The spin-on process and the misted deposition process remove some of the solvent, but some solvent remains after the coating. This solvent is removed from the wet film in drying steps 88 and 89. At the same time, the heating causes thermal decomposition of the organic elements in the thin film, which also vaporize and are removed from the thin film. This results in a solid thin film of the layered superlattice material 30 in a precrystallized amorphous state. This dried film is sufficiently rigid to support the next spin-on coat. The drying temperature must be above the boiling point of the solvent, and preferably above the thermal decomposition temperature of the organics in precursor solution. The preferred drying temperature is between the boiling point of the solvent and 500° C. and depends on the specific precursor used. The drying is preferably done in two steps 88 and 89, although it also may be done in one step or in more than two steps. The multiple step drying process is useful to prevent cracking and bubbling of the thin film which can occur due to excessive volume shrinkage by too rapid temperature rise. Preferably the first drying step 88 is a relatively low temperature step, preferably at temperature of from 140° C. and 180° C. for from 1 to 2 minutes, and most preferably at about 160° C. for one minute. Preferably the second drying step is at a temperature of from 200° C. to 320° C. for from 4 minutes to 8 minutes, and most preferably at a temperature about 260° C. for about 4 minutes. Preferably the drying is performed on a hot plate in air.

The drying step 88 is preferably followed by RTP bake steps 90 and 91. Rapid thermal processing is a process well-known in the integrated circuit art, and is sometimes misdescriptively referred to as rapid thermal annealing (RTA). Since this process does not always involve annealing, we prefer to refer to it more accurately as rapid thermal processing or RTP. Radiation from a halogen lamp, an infrared lamp, or an ultraviolet lamp provides the source of heat for the RTP bake step. In the examples, an AG Associates model 410 Heat Pulser utilizing a halogen source was used. Preferably, the first RTP bake 90 is performed in an oxygen atmosphere of between 20% and 100% oxygen, at a temperature between 300° C. and 500° C., and most preferably about 300° C., with a ramping rate between 1° C. per second and 175° C. per second, and most preferably 75° C. per second, and with a holding time of 5 seconds to 300 seconds, and most preferably 60 seconds. Optionally, this first RTP step may be replaced by an additional hot plate bake at a temperature higher than the first two hot plate bakes. The second RTP bake step 91 is performed in an inert atmosphere, preferably nitrogen and/or noble gases, such as argon, and most preferably, nitrogen, at a temperature between 500° C. and 850° C., and most preferably about 650° C., with a ramping rate between 1° C. per second and 175° C. per second, and most preferably 75° C. per second, and with a holding time of 5 seconds to 300 seconds, and most preferably 30 seconds. Any residual organics are burned out and vaporized during the RTP processes. At the same time, the rapid temperature rise of the RTP bake promotes nucleation, i.e. the generation of numerous small crystalline grains of the layered superlattice material in the solid film 30, 60. These grains act as nuclei upon which further crystallization can occur.

The thickness of a single coat, via the spin process or otherwise, is very important to prevent cracking due to volume shrinkage during the following heating steps 88 through 91 and 93. To obtain a crack-free film, a single spin-coat layer should preferably be less than 1500 Å (150 nanometers) after the bake step 89. Therefore, multiple coating is necessary to achieve film thicknesses greater than 2000 Å. The preferred film fabrication process includes RTP baking for each spin-on coat. That is, as shown in FIG. 1, the substrate 18 is coated, dried, and RTP baked, and then the process 92 is repeated as often as necessary to achieve the desired thickness. However, the RTP bake step is not essential for every coat. One series of RTP bake steps 90, 91 for every two coats is practical, and even just one series of RTP bake steps at the end of a series of coats is strongly effective in improving the electronic properties of most layered superlattice ferroelectrics. For some specific precursor/ layered superlattice material compositions, the RTP bake steps 90 and 91 are not necessary.

Once the desired film thickness has been obtained, the dried and preferably baked film is annealed in step 93, which is referred to as a first anneal to distinguish it from subsequent anneals. The first anneal is preferably performed in an inert atmosphere, preferably nitrogen and/or a noble gas, such as argon, and most preferably nitrogen, in a furnace. The temperature is above the crystallization temperature of the particular layered superlattice material 30, 60. To prevent evaporation of elements from the layered superlattice material 30, 60 and to prevent thermal damage to the substrate, including damage to integrated circuits already in place, the annealing temperature is preferably kept below 900° C. Preferably the annealing for strontium bismuth tantalate is done at between 650° C. and 900° C. The time for the anneal can vary from zero (no anneal) to an anneal with only the push/pull cycle, to a 13 hour holding time plus the push/pull cycle. Most preferably, for strontium bismuth tantalate, the anneal is done at a temperature of about 800° C. for 30 minutes, with a ten minute push/pull for a low thermal budget, and is in a similar range for most other layered superlattice materials.

After the first anneal, the second or top electrode 32 is formed. Preferably the electrode is formed by RF sputtering of a platinum single layer, but it also may be formed by DC sputtering, ion beam sputtering, vacuum deposition or other appropriate deposition process. If desirable for the electronic device design, before the metal deposition, the layered superlattice material 30 may be patterned using conventional photolithography and etching, and the top electrode 32 is then patterned in a second process after deposition. In the examples described herein, the top electrode 32 and layered superlattice material 30 are patterned together using conventional photolithography techniques and ion beam milling.

As deposited, the adhesion of the top electrode 32 to the layered superlattice material is usually weak. Preferably, the adhesion is improved by a heat treatment. The wafer 10 including the layered superlattice film 30 covered by the top electrode 32 may be annealed before the patterning step 95 described above, but preferably is annealed only after the patterning step 95 in step 96. The final anneal step 96 is preferably performed in an electric furnace at a temperature between 300° C. and 850° C., and most preferably at 800° C. or lower. The anneal is most preferably performed with a 10 minute push/pull and with a holding time of about 30 minutes. The anneal time may range from only the ten minute push/pull cycle, with no holding time, to a 60 minute holding time together with the push pull. The anneal step 96 is again preferably done in an atmosphere of nitrogen and/or a noble gas, such as argon, and most preferably in nitrogen. A low temperature oxygen anneal, that is an anneal in oxygen at a temperature of 600° C. or less is found to produce lower fatigue. The final anneal releases the internal stress in the top electrode 32 and in the interface between the electrode 32 and the layered superlattice material 30. At the same time, the second annealing step 96 reconstructs microstructure in the layered superlattice material 30 resulting from the sputtering of the top electrode, and as a result improves the properties of the material.

3. Examples of the Fabrication Process

Figure 5:
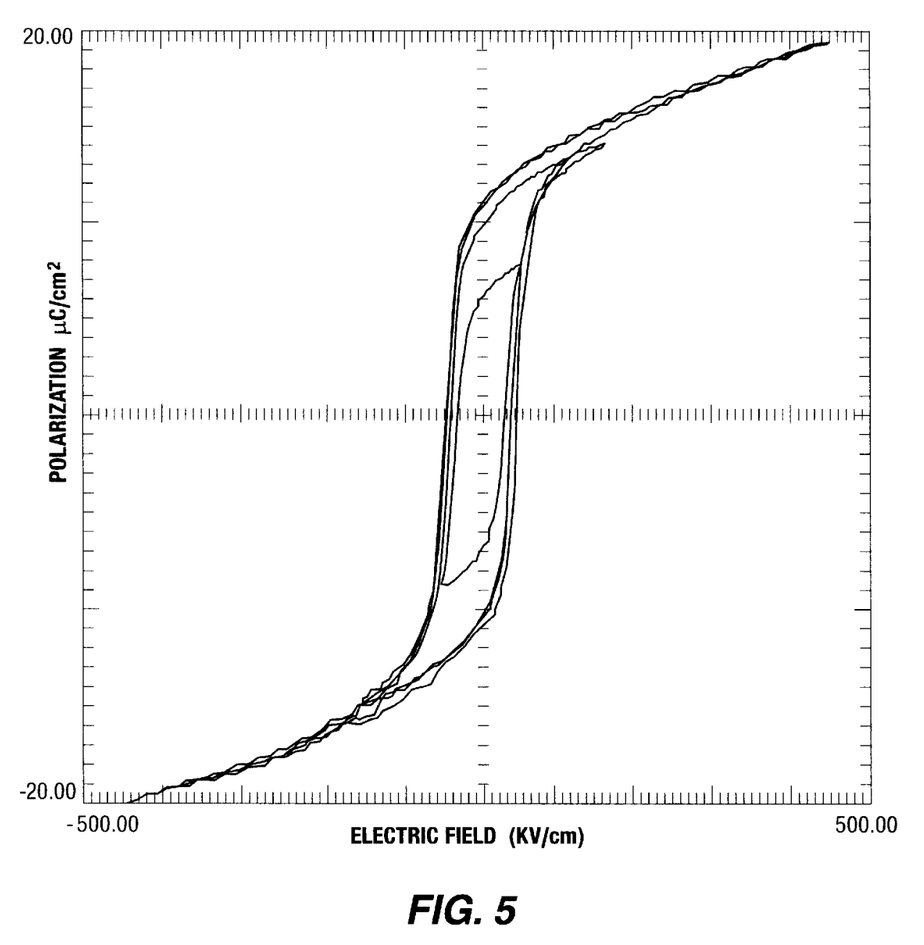
FIG. 5 shows hysteresis curves for 1, 3, 5 and 8 volts for a typical strontium bismuth tantalate thin film capacitor fabricated according to the process of FIG. 1.

Below, examples of the fabrication process according to the invention as applied to a wafer 10 as shown in FIGS. 2 and 3 are given. Following each of the examples, there is a discussion of the electrical/electronic properties illustrated in the figures. The figures include hysteresis curves, such as FIG. 5, and material endurance or "fatigue" curves such as FIG. 6. The hysteresis curves are given in terms of the applied electric field in kilovolts/centimeter (kV/cm) versus the polarization charge in microcoulombs per centimeter squared. Generally, the hysteresis is shown for four different voltages, 1 volt, 3 volts, 5 volts and 8 volts. As is well-known, hysteresis curves which suggest good ferroelectric properties tend to be relatively boxy and long in the direction of polarization, rather than thin and linear. The hysteresis measurements were all made on an uncompensated Sawyer-Tower circuit unless otherwise noted. The endurance or "fatigue" curves give the polarization charge, 2Pr, in microcoulombs per square centimeter and the coercive voltage, 2Ec in kV/cm versus the number of cycles. The polarization charge 2Pr is the charge created by switching a capacitor such as 16 from a state where it is fully polarized in one direction, say the upward vertical direction in FIG. 3, to the opposite fully polarized state, which would be the downward vertical direction in FIG. 3. Here, "fully polarized" means the state in which the ferroelectric material has been polarized fully and the field removed. In terms of an hysteresis curve, such as shown in FIG. 5, it is the difference between $Pr_+$, the point where the hysteresis curve crosses the positive polarization axis (y-axis), and $Pr_-$, the point where the hysteresis curve crosses the negative polarization axis. Unless otherwise noted, the value of 2Pr given is taken from the hysteresis measurement at the highest voltage. The higher the value of 2Pr, the better will be the performance of the material in ferroelectric memories and other applications. A cycle is defined as the capacitor, such as 16, being switched through one square pulse. This polarization, 2Pr, is approximately twice the remnant polarization, Pr. The parameter 2Ec is equal to the sum of the coercive field on the positive side, Ec+, and the coercive field on the negative side, Ec−, upon a voltage change, generally taken as from −8 to +8 volts for the figures shown. The coercive field is a measure of the size of the field that is required to switch the material from one polarization state to another. For a practical electronic device, it should be high enough that stray fields will not cause polarization switching, but if it is too high, large voltages will be required to operate the device. Other parameters and terms used in the figures and discussion should be clear from the context.

EXAMPLE 1

A wafer 10 including a number of capacitors 12, 14, 16, etc. was fabricated in which the layered superlattice material 30 was strontium bismuth tantalate. The precursor solution was purchased from Kojundo Chemical Laboratories, Co., Ltd. and comprised strontium 2-ethylhexanoate, bismuth 2-ethylhexanoate, and tantalum 2-ethylhexanoate in a xylenes or octane solvent. The plural "xylenes" is used instead of the singular "xylene", because commercially available xylene includes three different fractionations of xylene. The three metal 2-ethylhexanoates were mixed in a proportion such that the final thin film had the formula $SrBi_2Ta_2O_9$. The molarity of the solution was approximately 0.2 moles per liter. Just before coating, the precursor was diluted to 0.13 moles per liter by the addition of n-butyl acetate. A substrate 18 comprising a single crystal silicon layer 22, a 500 nanometer (nm) thick layer 24 of silicon dioxide, a 20 nm thick layer 26 of titanium, and a 200 nm thick layer 28 of platinum was prebaked at 650° C. in a diffusion furnace for 30 minutes with an oxygen flow of 6 liters/min. An eyedropper was used to place 1 ml of the $SrBi_2Ta_2O_9$ precursor solution on the substrate 18. The wafer was spun at 1500 RPM for 30 seconds. The wafer 10 was then placed on a hot plate and baked in air at about 160° C. for 1 minute and then at 260° C. for another 4 minutes. The wafer 10 was then RTP baked at 300° C. with a ramping rate of 75° C. per second, a hold time of 60 seconds, a natural cool time of 6 minutes, and an ambient oxygen flow of approximately 1000–2000 cc/minute. The wafer 10 was then RTP baked at 650° C. with a ramping rate of 75° C. per second, a hold time of 30 seconds, a natural cool time of 6 minutes, and an ambient nitrogen flow of approximately 1000–2000 cc/minute. The steps from using an eyedropper to deposit solution on the wafer through RTP baking were repeated for another coat. The wafer was then transferred to a diffusion furnace and annealed at 800° C. in a nitrogen flow of 6 l/min for 30 minutes. The top layer 32 of 200 nanometers (nm) platinum was sputtered, a resist was applied, followed by a standard photo mask process, an ion mill etch, an IPC strip and a second anneal at 800° C. in a nitrogen flow of about 6 l/min for 15 minutes. The final thickness of the layered superlattice film 30 was about 1700 Å and the area of the capacitor was about 7854 micrometers squared.

FIG. 5 shows initial hysteresis curves measured at 1, 3, 5 and 8 volts for the strontium bismuth titanate sample fabricated in Example 1. The hysteresis curves are vertically elongated and boxy suggesting excellent performance in an integrated circuit memory. Except for the 1 volt curve, the curves for different voltages lie nearly on top of one another, indicating little variability in performance with voltage, again an excellent prognostication for memory performance. The polarizability, 2Pr, was measured to be 22.08 microcoulombs/cm$^2$, which is about 30% better than the typical results obtained for $SrBi_2Ta_2O_9$ with the high temperature oxygen anneals of the prior art.

Figure 6:
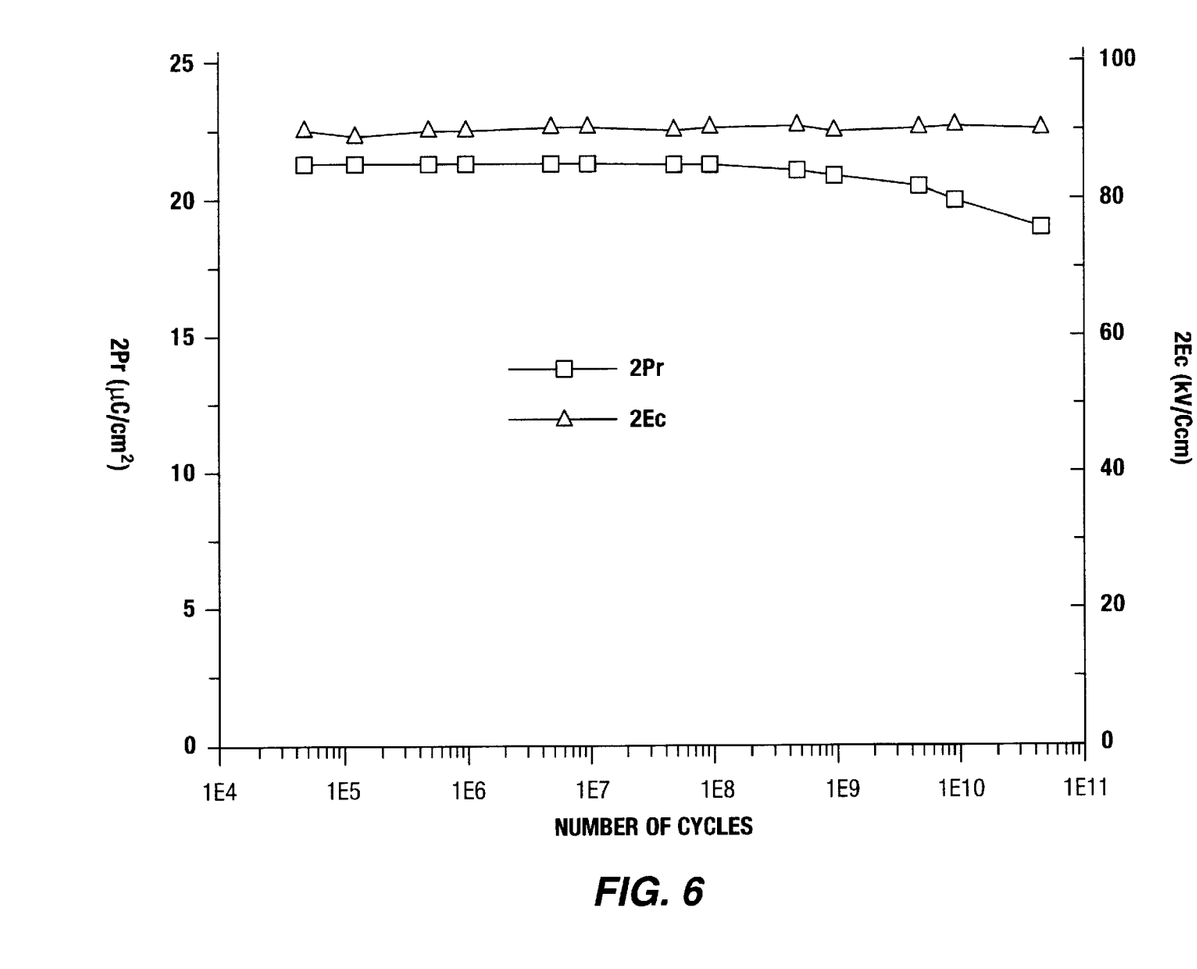
FIG. 6 shows polarizability and coercive field fatigue curves for the same thin film capacitor sample on which the hysteresis curves of FIG. 5 were measured.

FIG. 6 shows a graph of the polarizability, 2Pr, in microcoulombs per centimeter squared versus number of switching cycles as well as the coercive field, 2Ec, in kilovolts per cm versus number of switching cycles for the capacitor of Example 1. These curves illustrate what is known in the art as the fatigue properties of the material. The polarizability fatigues about 10% out to $10^{10}$ cycles and about 20% out to nearly $5 \times 10^{10}$ cycles. There is almost no fatigue at all of the coercive field, the variations being within experimental error. Since fatigue of up to 30% would have little effect on the performance of a ferroelectric memory with polarizabilities this high, these results indicate that a memory made of this material should last longer than the lifetime of a typical electronic device.

Figure 7:
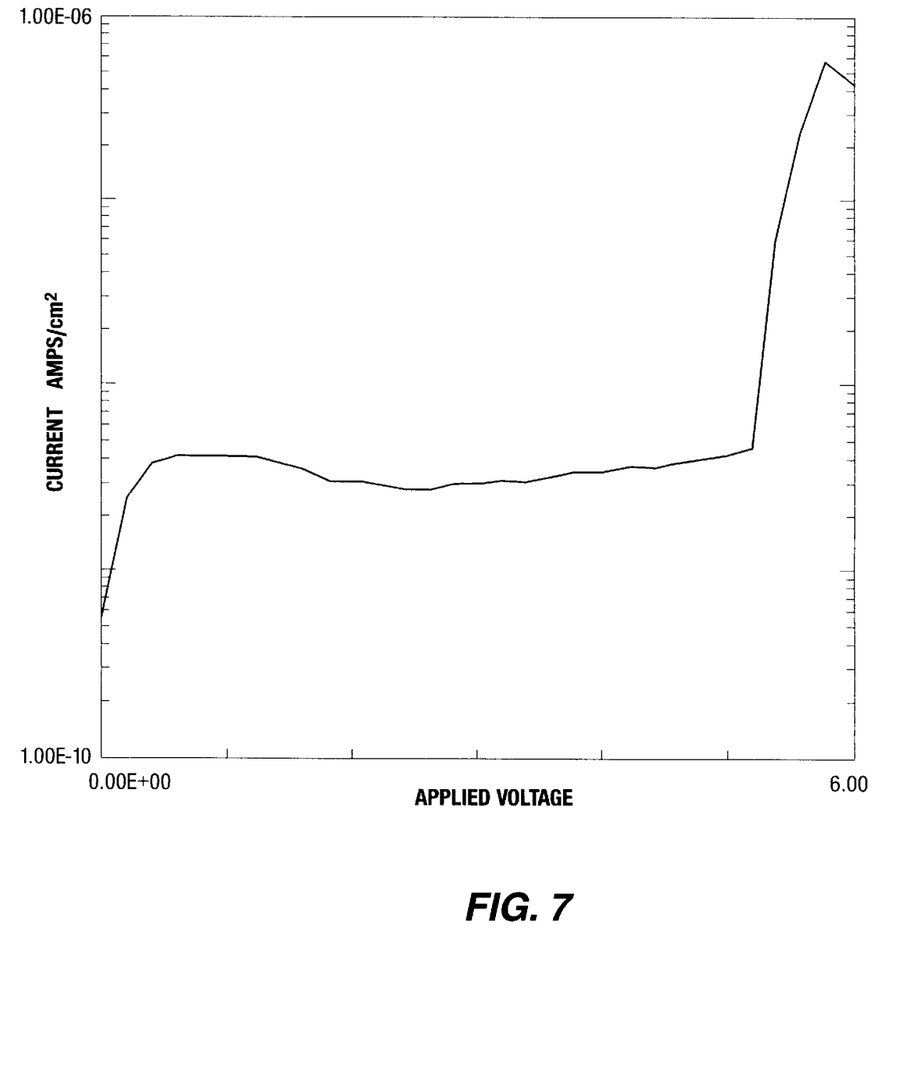
FIG. 7 shows a graph of leakage current versus applied voltage for the sample of FIGS. 5 and 6.

FIG. 7 shows a graph of the leakage current in amperes per centimeter squared versus the applied voltage in volts for the sample of Example 1. The leakage current rises to about $3 \times 10^{-9}$ amps per cm$^2$ at about 0.5 volts and stays flat out to about 5.25 volts, and then rises to about $6 \times 10^{-7}$ volts. Since the operating voltage of a conventional memory is about 3–5 volts, and any leakage current below $10^{-6}$ volts results in good memory performance, these results show that materials made by the process of Example 1 make excellent memories, whether the memories are ferroelectric memories or "dielectric" memories that utilize the high dielectric constant of the layered superlattice material for memory performance.

The above example illustrates the typical performance of many capacitors made according to the process of the invention. The following example illustrates the best performance obtained thus far.

EXAMPLE 2

A series of wafers 10 including a number of capacitors 12, 24, 16, etc. was fabricated in which the layered superlattice material 30 was strontium bismuth tantalate. The process was the same as that of the process of Example 1 except that the adhesion layer 26 was an approximately 40 nm thick layer of titanium dioxide formed by baking a 20 nm thick layer of titanium in oxygen at 800° C. for 30 minutes, the final thickness of the thin film 30 was about 180 nanometers, and the area of the capacitor was about 1980 micrometers squared.

Figure 8:
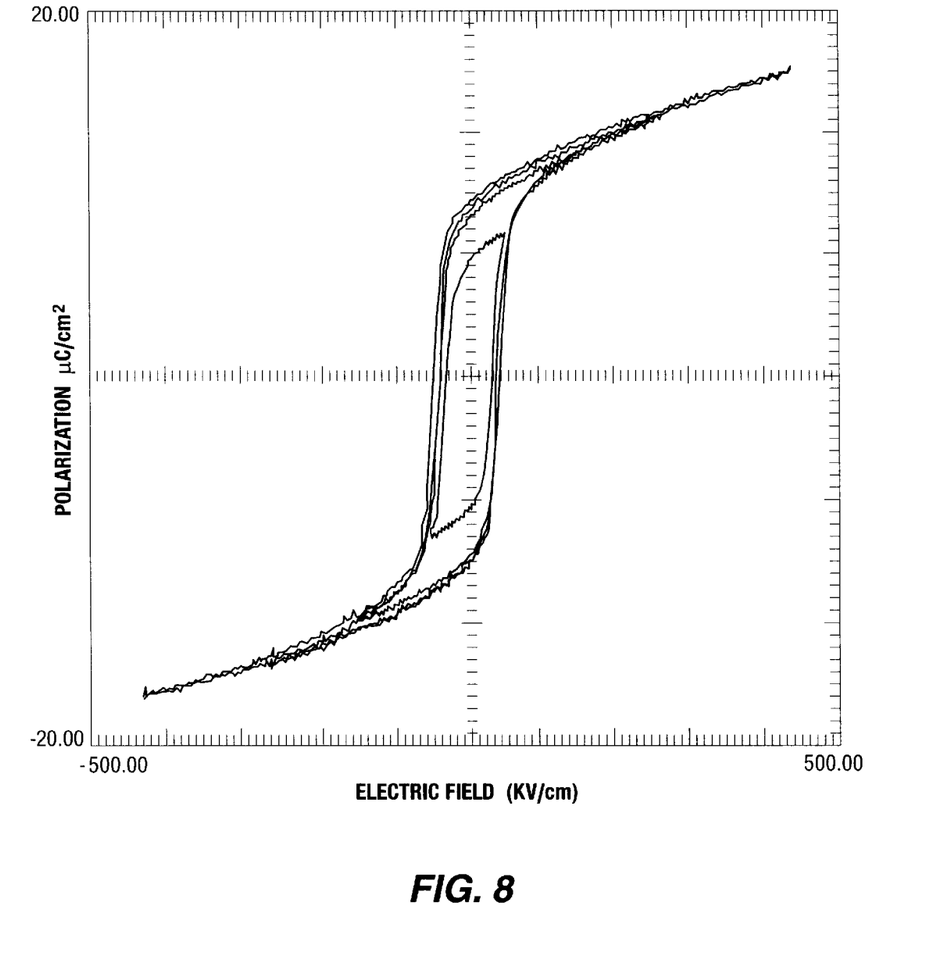
FIG. 8 shows hysteresis curves for 1, 3, 5 and 8 volts for another strontium bismuth tantalate thin film capacitor sample fabricated according to the process of FIG. 1.

FIG. 8 shows initial hysteresis curves measured at 1, 2, 3, 5 and 8 volts for the strontium bismuth titanate sample fabricated in Example 2. The hysteresis curves are even more vertically elongated and boxy as those for Example 1, suggesting excellent performance in an integrated circuit memory. The curves for different voltages lie nearly on top of one another, indicating little variability in performance with voltage; even the one-volt curve is within 30% of the curve for the highest voltage. The polarizability, 2Pr, was measured to be 29.24 microcoulombs/cm$^2$, which is better than the best results obtained for $SrBi_2Ta_2O_9$ with the high temperature oxygen anneals of the prior art.

Layered superlattice materials are much more complex than $ABO_3$ type metal oxides, and it is generally true that processes that are effective in making high quality layered superlattice materials are also effective in making high quality $ABO_3$ type materials, although the reverse is not true. Thus, the good results for layered superlattice materials indicates that the process should also be effective for $ABO_3$ type metal oxide compounds, such as PZT and BST.

There has been described processes and compositions for making electronic devices utilizing $ABO_3$ type metal oxides, such as PZT, BST and layered superlattice material compounds while only heating of the wafer with the layered superlattice material in an inert atmosphere, such as nitrogen, for process temperatures of greater than 600° C. Considering the fact that no example of making an $ABO_3$ type metal oxide such as PZT, BST, and layered superlattice material thin films of acceptable electronic quality for making an integrated circuit without using a high temperature oxygen anneal has been shown in the prior art, and, in fact, the prior art teaches that the high temperature oxygen anneal is essential to obtain high electronic quality thin films of these materials, it is surprising that such results have been obtained. These results are highly encouraging for the integration of layered superlattice materials into an otherwise conventional CMOS or other integrated circuit process, since the possibilities of oxidizing the silicon and metallic materials used in the conventional process is dramatically reduced by the process of the invention. It should be understood that the particular embodiments shown in the drawings and described within this specification are for purposes of example and should not be construed to limit the invention which will be described in the claims below.

Further, it is evident that those skilled in the art may now make numerous uses and modifications of the specific embodiment described, without departing from the inventive concepts. For example, now that it has been shown that a process in which no high temperature oxygen anneal of the layered superlattice material is used can result in superior electronic quality thin films, these processes can be combined with conventional processes using various known barrier layers etc. to provide variations on the processes described. It is also evident that the steps recited may in some instances be performed in a different order. Or equivalent structures and process may be substituted for the various structures and processes described. Or a variety of different dimensions and materials may be used. Consequently, the invention is to be construed as embracing each and every novel feature and novel combination of features present in and/or possessed by the fabrication processes, electronic devices, and electronic device manufacturing methods described.

We claim:

1. A method of fabricating a material selected from the group consisting of layered superlattice compounds, said method comprising:
   providing a substrate, and a precursor containing metal moieties in effective amounts for spontaneously forming said material upon heating said precursor;
   applying said precursor to said substrate to form a precursor film; and
   heating said precursor film in an oxygen-free atmosphere at a temperature of between 500° C. and 900° C. to form a solid thin film of said material on said substrate.

2. A method as in claim 1 wherein said step of heating comprises rapid thermal processing said precursor at a temperature of between 500° C. and 850° C.

3. A method as in claim 2 wherein said atmosphere comprises nitrogen, said rapid thermal processing temperature is about 650° C., and said rapid thermal processing is done for about 30 seconds.

4. A method as in claim 1 wherein said step of heating comprises annealing in an inert atmosphere at between about 700° C. and 900° C.

5. A method as in claim 4 wherein said step of annealing comprises annealing at a temperature of about 800° C. in a nitrogen atmosphere.

6. A method as in claim 1 wherein said substrate comprises a first electrode, and further comprising the steps of forming a second electrode on said material after said step of annealing, to form a capacitor, and subsequently performing a second anneal in an oxygen-free atmosphere at a temperature of between 300° C. and 900° C.

7. A method as in claim 6 wherein said second anneal temperature is about 800° C. and is in a nitrogen atmosphere.

8. A method as in claim 1 wherein said substrate comprises a first electrode, and further comprising the steps of forming a second electrode on said layered superlattice material, after said step of annealing, to form a capacitor, and subsequently performing a second anneal in oxygen at a temperature of between 600° C. or less.

9. A method as in claim 1 wherein said material comprises a layered superlattice material.

10. A method as in claim 9 wherein said layered superlattice material comprises strontium bismuth tantalate.

11. A method as in claim 1 and further including the step of rapid thermal processing said precursor film in an atmosphere including oxygen at a temperature of from 200° C. up to 500° C.

12. A method as in claim 11 wherein said step of rapid thermal processing in an atmosphere including oxygen comprises rapid thermal processing at a temperature of 300° C. prior to said step of heating.

13. A method as in claim 1 and further includes the step of drying said precursor film in air at a temperature of between 140° C. and 320° C.

14. A method as in claim 13 wherein said step of drying comprises a first drying step performed at a temperature of between 140° C. and 180° C. for 0.5 minutes to 2 minutes and a second drying step performed at a temperature of between 200° C. and 320° C. for from 3 minutes to 8 minutes.

15. A method as in claim 1 wherein said material comprises a material selected from the group consisting of PZT and BST.

16. A method as in claim 1 wherein said material forms a portion of an integrated circuit memory.

17. A method as in claim 16 wherein said memory is a memory selected from the group consisting of DRAMs and ferroelectric FETs.

18. A method of fabricating a layered superlattice compound, said method comprising:
    providing a substrate, and a precursor containing metal moieties in effective amounts for spontaneously forming said layered superlattice compound upon heating said precursor;
    applying said precursor to said substrate;
    drying said precursor to form a solid thin film; and
    heating said solid thin film on said substrate without exposing it to oxygen while at a temperature of higher than 600° C. to form said layered superlattice compound on said substrate.

19. A method as in claim 18 wherein said step of heating comprises rapid thermal processing said solid thin film at a temperature of between 600° C. and 850° C. in an inert atmosphere.

20. A method as in claim 18 wherein said step of heating comprises annealing said solid thin film at a temperature of from 700° C. to 900° C.

21. A method as in claim 18 wherein said substrate comprises a first electrode, and further comprising the steps of forming a second electrode on said material, after said step of heating, to form a capacitor, and subsequently to said step of forming a second electrode, annealing said capacitor in oxygen at a temperature of 600° C. or less.

22. A method as in claim 18 wherein said material forms a portion of an integrated circuit memory.

23. A method as in claim 22 wherein said memory is a memory selected from the group consisting of DRAMs and ferroelectric FETs.

24. A method of fabricating an $ABO_3$ type metal oxide thin film of a few thousand angstroms or less in thickness, said method comprising:
    providing a substrate, and a precursor containing metal moieties in effective amounts for spontaneously forming said metal oxide upon heating said precursor;
    applying said precursor to said substrate;
    drying said precursor to form a solid thin film;
    rapid thermal processing said dried solid thin film in an atmosphere including oxygen at a temperature of 500° C. or less; and then
    heating said solid thin film on said substrate without exposing it to oxygen while at a temperature of higher than 600° C. to form said metal oxide thin film on said substrate.

25. A method as in claim 24 wherein said material forms a portion of an integrated circuit memory.

26. A method as in claim 25 wherein said memory is a memory selected from the group consisting of DRAMs and ferroelectric FETs.

* * * * *